United States Patent
Wyles et al.

(10) Patent No.: US 9,380,244 B2
(45) Date of Patent: Jun. 28, 2016

(54) MULTI-COLOR SUPERPIXEL OPERATIONAL CONSTRUCTS FOR FOCAL PLANE ARRAYS

(71) Applicant: Raytheon Company, Waltham, MA (US)

(72) Inventors: Richard H. Wyles, Goleta, CA (US); Christopher L. Mears, Goleta, CA (US); Donald F. King, Goleta, CA (US); Peter C. Roberts, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 271 days.

(21) Appl. No.: 14/076,039

(22) Filed: Nov. 8, 2013

(65) Prior Publication Data
US 2015/0129746 A1    May 14, 2015

(51) Int. Cl.
*H01L 31/00* (2006.01)
*H04N 5/378* (2011.01)
*H01L 27/146* (2006.01)
*H04N 5/33* (2006.01)

(52) U.S. Cl.
CPC .......... *H04N 5/378* (2013.01); *H01L 27/14609* (2013.01); *H04N 5/332* (2013.01)

(58) Field of Classification Search
CPC ......... H01L 31/02; H01L 31/101; H04N 5/33
USPC ........ 250/208.1, 214.1, 226, 330, 332, 338.1, 250/339.01, 339.02; 257/440, 443, 444, 257/461
See application file for complete search history.

(56) References Cited

U.S. PATENT DOCUMENTS 5,113,076 A    5/1992  Schulte
6,885,002 B1*  4/2005  Finch ................... H04N 5/33
                                                   250/330

FOREIGN PATENT DOCUMENTS

WO    WO 03/021687 A2    3/2003
WO    WO 2012/064863 A1   5/2012

OTHER PUBLICATIONS

Bratt, et al. "Historical Perspectives on HgCdTe Material and Device Development at Raytheon Vision Systems", Proc. of SPIE vol. 7298 Apr. 18, 2012 (pp. 72982U-1-72982U-35).
Schaake, et al. "256X256 MW/MW Focal Plane Arrays for Navy Missile Threat Warning Applications", DRS infrared Technologies, L.P., Dallas, Texas 75243 (7 pages). (This Document was presented at the Conference on Mar. 26, 2004 with publications of the proceedings some months thereafter).

(Continued)

*Primary Examiner* — Kevin Pyo
(74) *Attorney, Agent, or Firm* — Lewis Roca Rothgerber Christie LLP

(57) ABSTRACT

A method for sensing using a multi-band photovoltaic detector, the method including biasing the photovoltaic detector using a bias voltage at a mid-point of a detector substrate bias voltage range, selecting a first band of the multi-band photovoltaic detector, sensing a first current from a first diode of the multi-band photovoltaic detector, the first diode being associated with the first band, selecting a second band of the multi-band photovoltaic detector; and sensing a second current from a second diode of the multi-band photovoltaic detector, the second diode being associated with the second band.

15 Claims, 5 Drawing Sheets

(56) References Cited

OTHER PUBLICATIONS

Written Opinion of the International Searching Authority for International Application No. PCT/US2014/064439, filed Nov. 6, 2014, Written Opinion of the International Searching Authority mailed Jul. 9, 2015 (7 pgs.).

International Search Report for International Application No. PCT/US2014/064439, filed Nov. 6, 2014, International Search Report dated Jul. 2, 2015 and mailed Jul. 9, 2015 (3 pgs.).

* cited by examiner

Frame n

Frame n+1

Frame n+2

US 9,380,244 B2

MULTI-COLOR SUPERPIXEL OPERATIONAL CONSTRUCTS FOR FOCAL PLANE ARRAYS

FIELD

Embodiments of the present invention relate to the field of high-speed optical imaging systems, and more specifically to optical imaging systems employing stacked multi-band photovoltaic detectors.

BACKGROUND

Advancements in photodetector technology, especially in the infrared (IR) photodetector arena, has led to the integration of single element detectors operating in photovoltaic mode into multi-element linear arrays, 2D arrays on Silicon read-out circuits, and very large focal plane arrays (FPAs) having upwards of millions of photodetector elements.

The advent of multi-band detectors, such as stacked (or back-to-back) photovoltaic detectors, has greatly simplified the design of dual-band or multi band image sensors and photodetector devices, which are highly desirable in many civil and military applications, such as target detection systems.

Current dual-band vision systems are limited by the fact that dual-band FPAs employing stacked (or back-to-back) bias-selectable photovoltaic detectors are, at any given time, capable of operating either in a first spectral band or a second spectral band, but not both simultaneously. Therefore, one existing method for capturing an image in two separate colors (or spectral bands) involves the use of time division multiplexing (TDM) to create the perception of temporally simultaneous two-color detection. Using this approach, the array captures light of a first spectral range for a period of time (e.g., 100 μs) and then the entire array switches to capturing light of a second spectral band for another period of time. However, this approach does not appear to yield the desired performance (sensitivity) that is required in high speed detection systems, such as those used on missile warning systems on planes.

Accordingly, what is desired is a high speed multi-band detection system capable of capturing light at different spectral bands in a temporally simultaneous and (nearly) spatially coincident manner.

Further, given the difficulty of manufacturing a faultless detector array operating in the IR range; what is desired is a multi-band detection system that is fault tolerant without sacrificing overall system operability.

SUMMARY

According to embodiments of the present invention, the use of a pixel aggregation concept with multi-color biasing scheme on read-out integrated circuits (ROICs) results in flexible, time synchronous, multi-color focal plane arrays (FPAs).

According to embodiments of the present invention, FPA yields may be improved through pixel aggregation (e.g., discarding poor performing pixels without sacrificing system operability). Further, by employing a scheme of biasing multi-color arrays (e.g., two color arrays), some embodiments of the present invention offer time-synchronous operation of different colors in a variety of geometric patterns, which may provide benefits in certain applications such as airborne missile warning systems or sensors for navigation and targeting.

According to some embodiments of the present invention, there is provided a method for sensing using a multi-band photovoltaic detector, the method including: biasing the photovoltaic detector using a bias voltage at a mid-point of a detector substrate bias voltage range; selecting a first band of the multi-band photovoltaic detector, sensing a first current from a first diode of the multi-band photovoltaic detector, the first diode being associated with the first band, selecting a second band of the multi-band photovoltaic detector; and sensing a second current from a second diode of the multi-band photovoltaic detector, the second diode being associated with the second band.

The selecting of the first band may further include: reverse biasing the first diode; and forward biasing the second diode, wherein said reverse biasing the first diode and said forward biasing the second diode are performed substantially simultaneously. Similarly, selecting the second band may further include: reverse biasing the second diode; and forward biasing the first diode, wherein said reverse biasing the second diode and said forward biasing the first diode are performed substantially simultaneously.

According to some embodiments of the present invention, there is provided a multi-band photovoltaic detector circuit including: a first band selector configured to select a first band of the multi-band photovoltaic detector, a first band switch controlled by the first band selector and configured to reverse bias a first diode of a back-to-back photovoltaic detector, the first diode being associated with the first band, a first reset switch controlled by the first band selector and coupled to a readout line, a second band selector configured to select a second band of the multi-band photovoltaic detector, a second band switch controlled by the second band selector and configured to reverse bias a second diode of the back-to-back photovoltaic detector, the second diode being associated with the second band; and a second reset switch controlled by the first band selector and coupled to the readout line, wherein the back-to-back photovoltaic detector is biased at a mid-point of a detector substrate bias voltage range.

According to some embodiments of the present invention, there is provided a multi-band light-detecting superpixel including: at least four pixels, each pixel of the at least four pixels including a back-to-back photovoltaic detector and a multi-band photovoltaic detector circuit, wherein each back-to-back photovoltaic detector is configured to detect light in a first band and in a second band, wherein each of the pixels is configured to selectively detect light in the first band or the second band.

Further, the pixels selected to detect light of a same band may be positioned according to a checkerboard pattern or a striped pattern.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1:
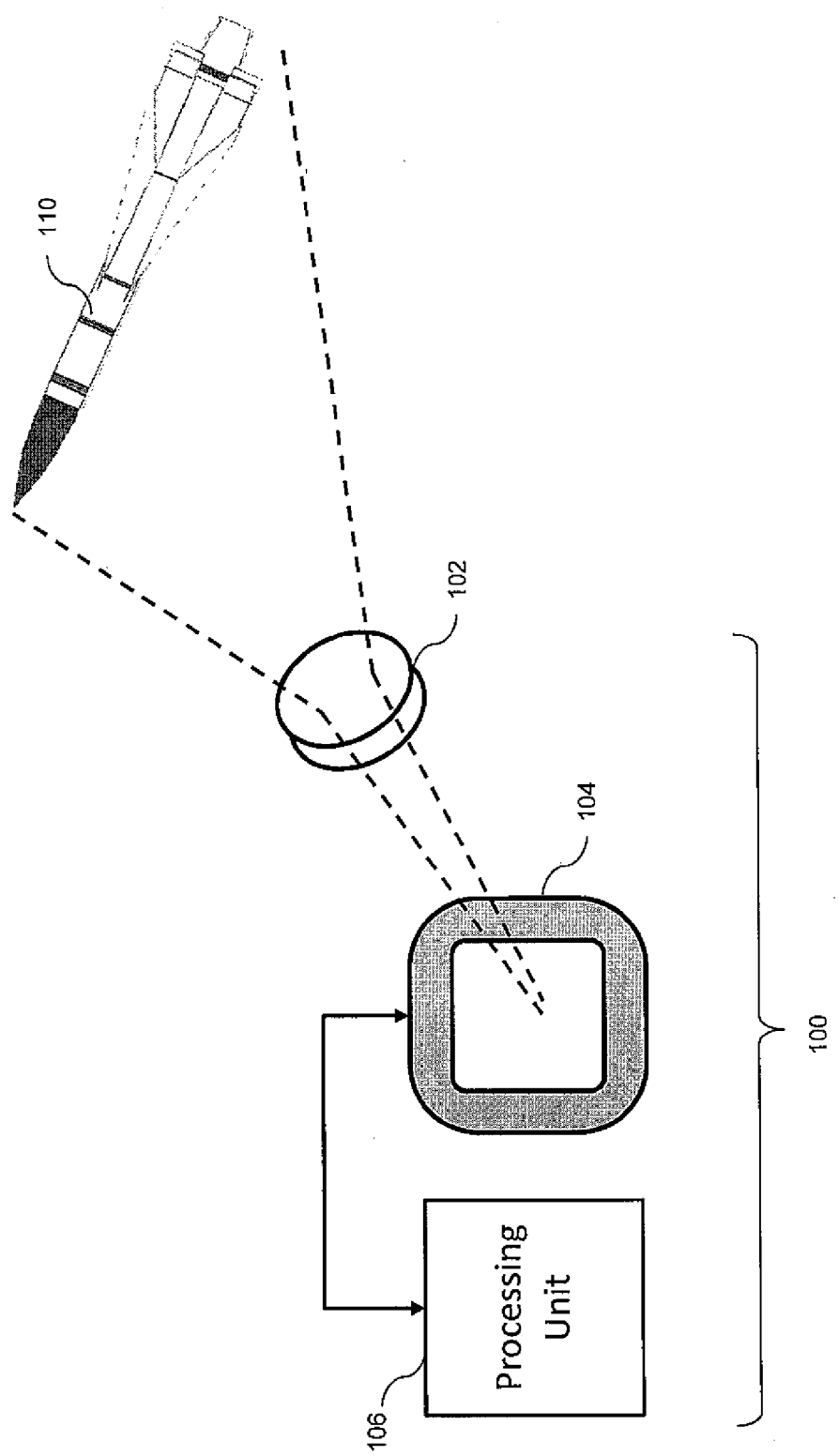
FIG. 1 is a diagram illustrating the use of a multi-band vision system for detection of a target, according to some embodiments of the present invention.

In the following detailed description, only certain example embodiments of the present invention are shown and described, by way of illustration. As those skilled in the art would recognize, the invention may be embodied in many different forms and should not be construed as being limited to the embodiments set forth herein. Like reference numerals designate like elements throughout the specification.

Aspects of embodiments of the present invention are directed to a system and a method for using a multi-color biasing scheme on read-out integrated circuits (ROICs) resulting in flexible, time synchronous, multi-color focal plane arrays (FPAs). Unlike existing solutions, embodiments of the present invention provide band switching capability at the individual stacked detector level (i.e., at pixel level of an array). According to some embodiments, the biasing scheme involves biasing a stacked (back-to-back) photovoltaic detector with a voltage that is at a midpoint of a detector substrate voltage range. In some embodiments, the stacked photodetector may have only one point of contact with a detector control circuit (also referred to as a pixel driver), thus simplifying overall design and permitting smaller pixel sizes.

According to some embodiments of the present invention, manufacturing yields of FPAs may be improved (or increased) by making the array fault tolerant through the use of pixel aggregation, which involves discarding poor performing pixels without sacrificing system operability. Further, by employing a scheme of biasing multi-color arrays (e.g., two color arrays), embodiments of the present invention offer time-synchronous operation of different colors in a variety of geometric patterns, which may provide benefits in certain applications such as airborne warning systems.

FIG. 1 illustrates an exemplary vision system (or detection system) that uses a multi-band FPA for detecting a target, according to an embodiment of the present invention. In one example, the multi-band vision system 100 includes optical instruments 102, a multi-band FPA 104, and a processing unit 106.

According to some embodiments, the optical instruments 102 receive incoming light from a target 110 and focus the received light onto the multi-band FPA 104, which may capture light at two or more spectral bands in a temporally simultaneous and (nearly) spatially coincident manner. In some embodiments, the multi-band FPA 104 includes an array of dual-band photovoltaic detectors for sensing light of two different spectral bands, and one or more dual-band detector circuits for controlling the array of the dual-band photovoltaic detectors and for capturing a signal corresponding to the light intensities sensed at each detector. The resulting electrical signals may be passed onto a processing unit 106 to, for example, perform image processing and translate captured data into one or more viewable images.

Figure 2:
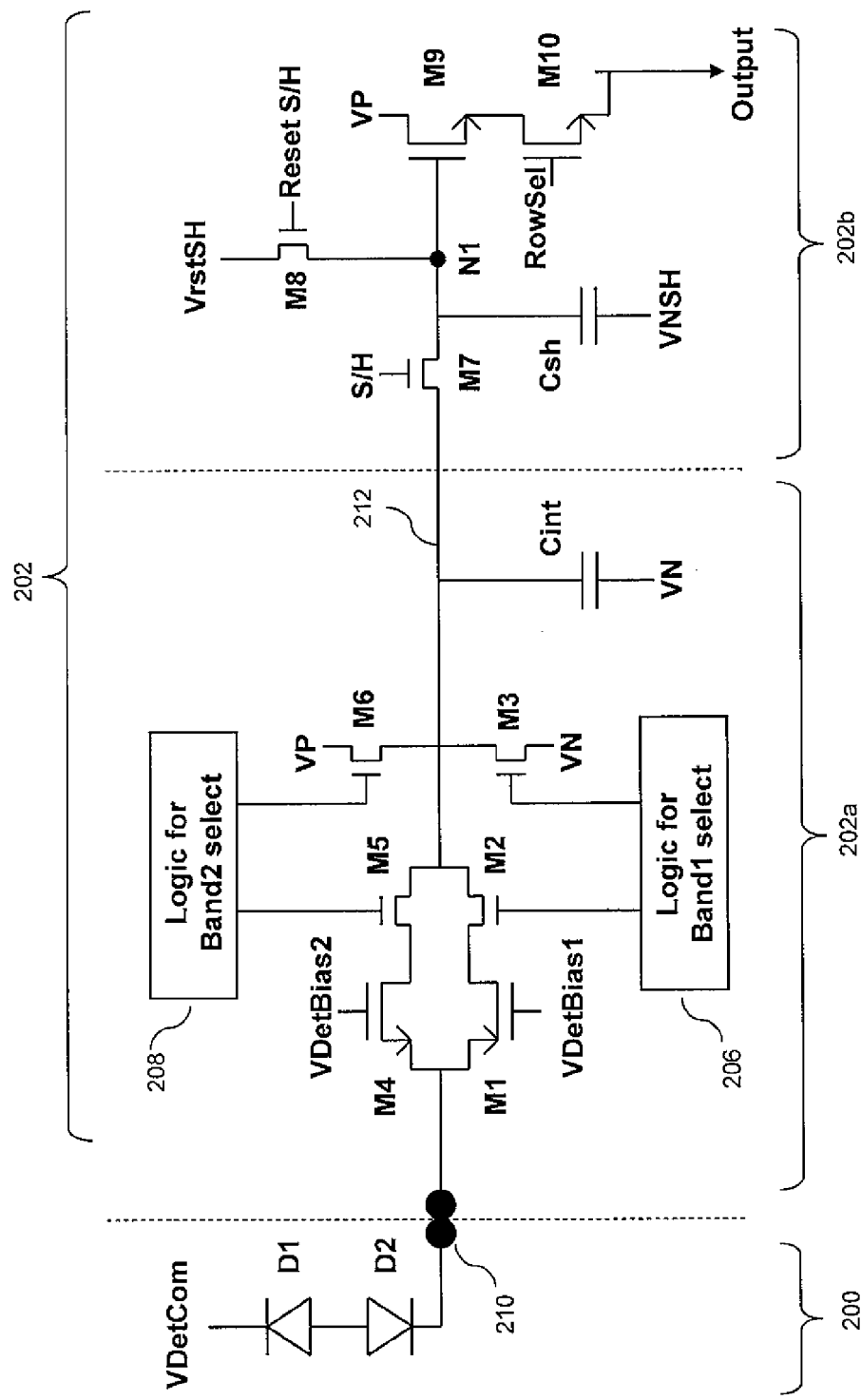
FIG. 2 is a schematic diagram of a dual-band photovoltaic detector circuit, according to some embodiments of the present invention.

FIG. 2 is a schematic diagram of a dual-band photovoltaic detector circuit, according to some embodiments of the present invention. In some embodiments, the dual-band photovoltaic detector 200 (hereinafter also referred to as a "stacked detector") is coupled to a dual-band photovoltaic detector circuit 202 through a single contact/bump node 210. The dual-band photovoltaic detector circuit 200 may be conceptualized as a dual-band photovoltaic detector control circuit 202a (hereinafter also referred to as "dual-band control circuit") and a pixel readout circuit 202b.

According to some embodiments, the stacked detector 200 may include two back-to-back photodiodes D1 and D2 that are vertically stacked. The stacked detector 200 may be a two-terminal multi-band infrared radiation (IR) detector including a first heterojunction and a second heterojunction electrically coupled together in series between two electrical contacts, as, for example, disclosed in U.S. Pat. No. 5,113,076, the entire disclosure of which is expressly incorporated by reference herein. The two heterojunctions may electrically function as two back-to-back diodes, such that when one diode is forward biased, the other is in reverse bias mode, and vice versa. Each diode may sense light of a different spectral band. In some embodiments, the two spectral bands are within the infrared radiation (IR) range. For example, one spectral band may be the long-wave (LWIR, or 8-14 micron wavelength) band and the other spectral band may be the mid wave (MWIR, or 3-5 microns) band. For example, LWIR may be ideal for background scenes such as runways, terrain, traffic, structures, and obstacles. Its use may be particularly suitable at night, and/or in the presence of obscurants such as haze, smoke, and rain.

However, as a person of ordinary skill in the art will recognize, the scope of the present invention is not limited to dual-band detectors operating in the IR range, and extends to detectors operating in other parts of the spectral range such as the ultraviolet (UV) range.

According to some embodiments of the present invention, the dual-band photovoltaic detector 200 is biased using a detector common voltage $V_{DetCom}$, which may be maintained at a voltage near the midpoint of a substrate bias voltage range. For example, if the device substrate is biased with a high substrate voltage of 3.2v and a low substrate voltage of 0v, then a detector common voltage $V_{DetCom}$ of 1.6v may be applied to the stacked detector.

According to some embodiments, the stacked detector 200 and the dual-band control circuit 202 may be formed on separate wafers. For example, the dual-band control circuit 202 may be formed on a silicon (Si) wafer and the stacked detector 200 may be formed on a Mercury-Cadmium-Telluride wafer.

In some embodiments, the stacked detector 200 may be coupled to the dual-band control circuit 202a via a single contact, e.g. a single bump node 210. The single node contact has the advantage of reducing overall pixel size, thereby allowing, for example, higher resolution FPAs. In other embodiments, more than one contact may be used to couple the stacked detector 200 and the dual-band photovoltaic detector circuit 202. For example, each band may have a separate corresponding contact, such as some embodiments with two bump nodes for a dual-band stacked detector.

According to some embodiments, the dual-band control circuit 202a may include a first band control circuit and a second band control circuit, which may be substantially similar to the first band control circuit, and an integration capacitor $C_{INT}$. In some embodiments, the first band control circuit may include a first band selector 206 for selecting a first band of the dual-band stacked detector 200 and for controlling the "on/off" states of the first reset switch M3 and a first band switch. The reset switch M3 may include a gate electrode that is coupled to the first band selector 206, a first electrode coupled to a first power supply $V_N$, and a second electrode coupled to an integration node 212. The first band selector 206 may electrically couple the single bump node 210 to the integration node 212 in response to a control signal from the first band selector 206. The first band switch may include a first enable switch M2, and a first bias control switch M1. For example, the first enable switch may have a gate electrode coupled to the first band selector 206, a first electrode coupled to integration node 212, and a second electrode coupled to an electrode (e.g., the drain) of the first bias control switch M1. The first bias switch M1 may have a source coupled to the single bump node 210 and a gate electrode coupled to a first band detector bias voltage $V_{DetBias1}$ which may be maintained at a constant voltage below the detector common voltage $V_{Detcom}$. For example, the first band detector bias voltage $V_{DetBias1}$ may be determined based on the following approximate equation:

$$V_{DetBias1} = V_{DetCom} - V_{th1} \quad (1)$$

where, $V_{th1}$ represents the magnitude of the threshold voltage of the first bias control switch. For instance, when $V_{DetCom}=1.6$ v and $V_{th1}=1$v, the first band detector bias voltage $V_{DetBias1}$ may be approximately 0.6 v.

Similarly, in some embodiments of the present invention, the dual-band control circuit 202a may include a second band control circuit, which may be substantially similar to the first band control circuit, and an integration capacitor $C_{INT}$. In some embodiments, the second band control circuit may include a second band selector 208 for selecting a second band of the dual-band stacked detector 200 and for controlling the "on/off" states of the second reset switch M6 and a second band switch M5. The second reset switch M6 may include a gate electrode that is coupled to the second band selector 208, a second electrode coupled to a second power supply $V_P$ and a third electrode coupled to a integration node 212. The second band selector 208 may electrically couple the single-bump node 210 to the integration node 212 based on a control signal from the second band selector 208. The second band switch may include a second enable switch M5, and a second bias control switch M4. For example, the second enable switch may have a gate electrode coupled to the second band selector 208, a second electrode coupled to integration node 212, and a third electrode coupled to, for example, the drain of the second bias control switch M4. The second bias switch M4 may have a source coupled to the single bump node 210 and a gate electrode coupled to a second band detector bias voltage $V_{DetBias2}$, which may be maintained at a constant voltage above the detector common voltage $V_{Detcom}$. For example, the second band detector bias voltage $V_{DetBias1}$ may be determined based on the following approximate equation:

$$V_{DetBias2} = V_{DetCom} + V_{th2} \quad (2)$$

where, $V_{th2}$ represents the threshold voltage of the second bias control switch. For instance, when $V_{DetCom}=1.6$ v and $V_{th2}=1$ v, the second band detector bias voltage $V_{DetBias2}$ may be approximately 2.6 v.

In some embodiments, the two back-to-back diodes D1 and D2 operate at close to zero volts bias, as such, the first and second bias switches M1 and M4 serve to maintain the voltage at the single bump node at approximately the common voltage $V_{DetCom}$.

According to some embodiments, the integration capacitor $C_{INT}$ may have a second electrode coupled to the first power supply $V_N$, and a second electrode coupled to the integration node 212. The first power supply $V_N$ may, for example, be used as a common ground and be set to 0v. As such, the integration capacitor $C_{INT}$ may store a charge corresponding to the photocurrent flowing through the dual-band photovoltaic detector 200 during a detection phase.

According to some embodiments of the present invention, the pixel readout circuit 202b may be coupled to dual-band control circuit 202a via the integration node 212. In one example, the pixel readout circuit 202b may include a sample-and-hold (S/H) switch M7, a S/H capacitor $C_{SH}$, a S/H reset switch M8, a source follower M9, and a row select switch M10. In an example, switches M7, M8, and M10 and the source follower M9 may be implemented using NFET or PFET transistors, or the like.

A first electrode of the S/H switch M7 may be coupled to the integration node 212, a second electrode of the S/H switch M7 may be coupled to a node N1. The first electrode of the S/H capacitor $C_{SH}$ may be coupled to a third power supply $V_{NSH}$, which may, for example, be at a same voltage as the first power supply $V_N$, and a second electrode of the S/H capacitor $C_{SH}$ may be coupled to the node N1. The gate of the S/H switch M7 may be coupled to a line carrying a S/H control signal which turns the switch on or off. When the S/H switch M7 is in an on state, some of the charges stored in the integration capacitor $C_{INT}$ will be transferred to the S/H capacitor $C_{SH}$, thus inducing a voltage across the S/H capacitor $C_{SH}$ that is proportional to the voltage across the integration capacitor $C_{INT}$ resulting from the photocurrent flowing through it during the detection phase. Accordingly, the pixel read out circuit 202b may read or sample the voltage across the integration capacitor $C_{INT}$, which is indicative of the light intensity of a first band or second band detected by the dual-band photovoltaic detector 200. When the S/H switch M7 is in an off state, the S/H capacitor $C_{SH}$ may be electrically isolated from the dual-band control circuit 202a allowing the voltage across the S/H capacitor $C_{SH}$ to be measured and communicated to outside circuitry.

The S/H reset switch M8 may have a first electrode coupled to a fourth power supply $V_{RstSH}$, which may, for example, be at a same voltage as the third power supply $V_{NSH}$. The second electrode of the S/H reset switch M8 may be coupled to the node N1 and the gate of the switch may be controlled by a S/H reset signal. When a S/H reset signal is supplied to the S/H reset switch M8 the voltage at node N1 may be reset to a preset value. When no S/H reset signal is supplied, the node N1 is isolated from the fourth power supply $V_{RstSH}$ and, consequently, a voltage sampled by S/H capacitor $C_{SH}$ may be measured and communicated to outside circuitry.

The source follower M9 may have a first electrode coupled to a power source, such as the second power source $V_P$, and a gate coupled to the node N1. A second electrode of the source follower M9 may be coupled to a first electrode of a row select switch M10. The row select switch M10 may have a gate electrode coupled to a line carrying a row select signal and a second electrode coupled to an output. The source follower serves to isolate the dual-band photovoltaic detector circuit 202 from an external circuit by preventing the external circuit from loading the dual-band photovoltaic detector circuit 202. When the row select signal is supplied, the row select switch M10 may allow the sampled voltage at node N1 to be output to external circuitry. The row select signal may concurrently be supplied to all or a subset of pixel readout circuits 202b of pixels in a row of a photodetector array.

Figure 3:
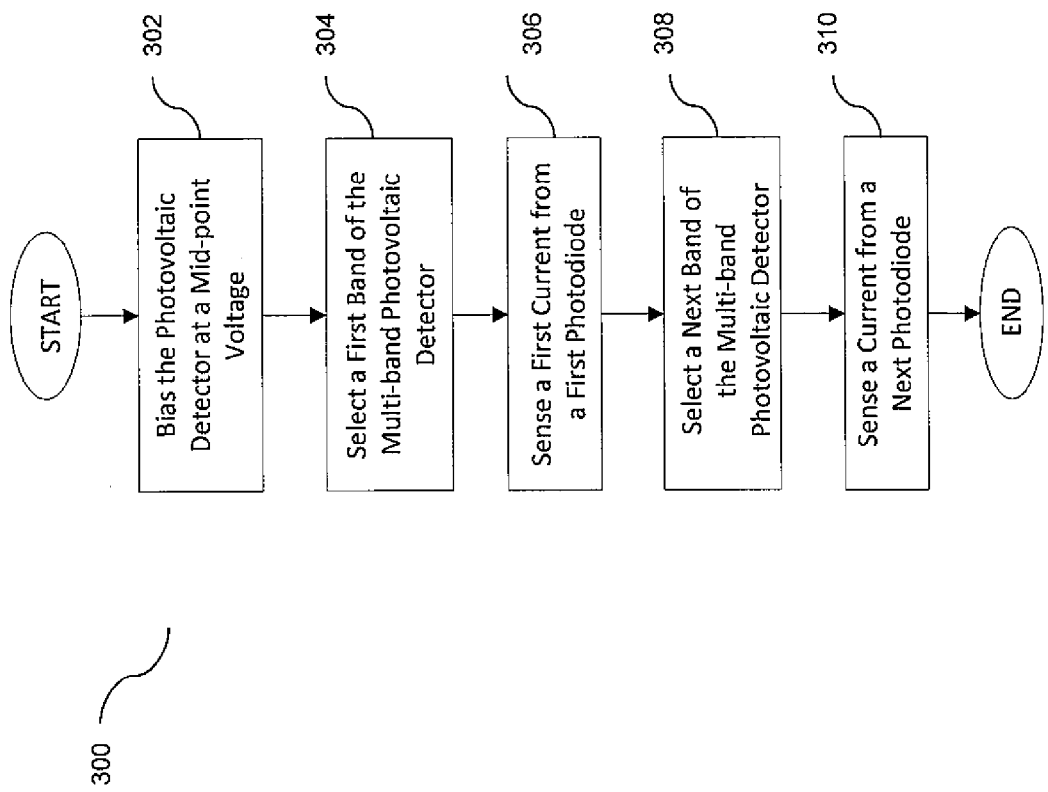
FIG. 3 is a flow diagram of a process for sensing light of two different spectral bands for a single pixel, according to some embodiments of the present invention.

FIG. 3 is a flow diagram of a process for sensing light of two different spectral bands (e.g. two different colors) within a single pixel, according to some embodiments of the present invention. Different pixels in the sensor may sense the same or different spectral bands at any given instant in time.

In block 302, the stacked detector 200 is biased at a voltage at approximately the mid-point of the detector substrate bias range. For example, if the substrate bias range is 3.2v then a detector common voltage $V_{DetCom}$ of 1.6v may be applied to the stacked detector.

In block 304, a first band of the multi-band photovoltaic detector is selected for a particular pixel; different pixels may have different bands selected. In some embodiments, the first band selector 206 may first send an on signal to the gate of the first reset switch M3 to turn it on, which may in turn reset the voltage at the integration capacitor $C_{INT}$ to a preset voltage, for example, 0v. Meanwhile, the first enable switch M2 may or may not be maintained in an off state to cut off a current flow path through the first reset switch M3 to the stacked detector 200. The second enable switch M5 and the second reset switch M6 may also be maintained in an off state. After a period of time, the first band selector 206 may send an off signal to the gate of the first reset switch M3 to turn it off. The first band selector 206 may then send an on signal to the gate of the first enable switch M2 to turn it on, thus establishing a current flow path from the stacked detector 200 to the integration capacitor $C_{INT}$. Because detector common voltage $V_{DetCom}$ is at a higher voltage than the second electrode of the integration capacitor $C_{INT}$, which may initially reside at 0v, the first photodiode D1 is reverse biased, while the second photodiode D2 is forward biased. While reverse biased, photodiode D1 may convert incident light of the first spectral band to a photocurrent, which may in turn be captured (or integrated) by the integration capacitor $C_{INT}$, in block 306.

According to some embodiments of the present invention, in block 306, the pixel read-out circuit 202b may read (e.g., sample) the voltage at the integration capacitor $C_{INT}$, which represents the detected light intensity of first spectral band, and provide it to an external circuit. For example, the S/H switch M7 may turn on connecting the S/H capacitor $C_{SH}$ and the integration capacitor $C_{INT}$ in parallel, thus, allowing a sharing of charges stored at the integration capacitor $C_{INT}$ and inducing a voltage $V_{SH}$ across the S/H capacitor $C_{SH}$ that is proportional to the voltage $V_{INT}$ across the integration capacitor $C_{INT}$ resulting from the photocurrent flowing through it during the first band detection phase. The relationship between the noted voltages may be expressed as:

$$V_{SH} = [C_{INT}/(C_{INT}+C_{SH})] \times V_{INT} \quad (3)$$

wherein $C_{INT}$ and $C_{SH}$ represent the capacitance of the integration capacitor $C_{INT}$ and S/H capacitor $C_{SH}$, respectively. By turning the S/H switch M7 off, the S/H voltage $V_{SH}$, which is proportional to the intensity of the detected light during the first band detection phase, may be held (or remain unchanged) until it is read by an external circuit. The S/H voltage may be read out by an external circuit through the source follower M9 when the row select switch M10 is turned on (e.g., when the row in which the pixel resides is selected for read-out). Every time a S/H voltage is read out, the S/H reset switch M8 may be turned on to reset the voltage across the S/H capacitor $C_{SH}$ to a preset value (e.g., a voltage equal to that of the fourth power supply $V_{RstSH}$).

In block 308, a first band of the multi-band photovoltaic detector is deselected and a second band of the multi-band photovoltaic detector is selected. In some embodiments, the first band selector 206 sends an off signal to the gate of the first enable switch M2 and turns it off. The second band selector 208 may then first send an on signal to the gate of the second reset switch M6 to turn it on, which may in turn reset the voltage at the integration capacitor $C_{INT}$ to the voltage $V_P$ (e.g., 3.2v). Meanwhile, the second enable switch M5 will be maintained in an off state to cut off a current flow path through the second reset switch M6 to the stacked detector 200. After a period of time, the first band selector 206 may send an off signal to the gate of the first reset switch M3 to turn it off. The first band selector 208 may then send an on signal to the gate of the second enable switch M5 to turn it on, thus, establishing a current flow path from the stacked detector 200 to the integration capacitor $C_{INT}$. Because detector common voltage $V_{DetCom}$ is at a lower voltage than the second electrode of the integration capacitor $C_{INT}$ which may initially reside at 3.2v, the second photodiode D2 is reverse biased, while the first photodiode D1 is forward biased. While reverse biased, second photodiode D2 may convert incident light of the first spectral band to a photocurrent, which may in turn be captured by the integration capacitor $C_{INT}$, in block 310.

According to some embodiments, in block 310, the pixel read-out circuit 202b may read (e.g., sample) the voltage at the integration capacitor $C_{INT}$, which represents the detected light intensity of second spectral band, and provide it to an external circuit in manner similar to that described above for block 306.

Because of the capability of the pixel read out circuit 202b to sample and hold the voltage sensed by the dual-band control circuit 202a, the dual-band photovoltaic detector circuit 202 may be able to detect a light of one spectral band while simultaneously providing the previously sensed voltage corresponding to another detected spectral band to an external circuit, thus greatly enhancing detection performance. The capability to integrate in one color while reading out the other color information may be more commonly referred to as pipelining.

Figure 4:
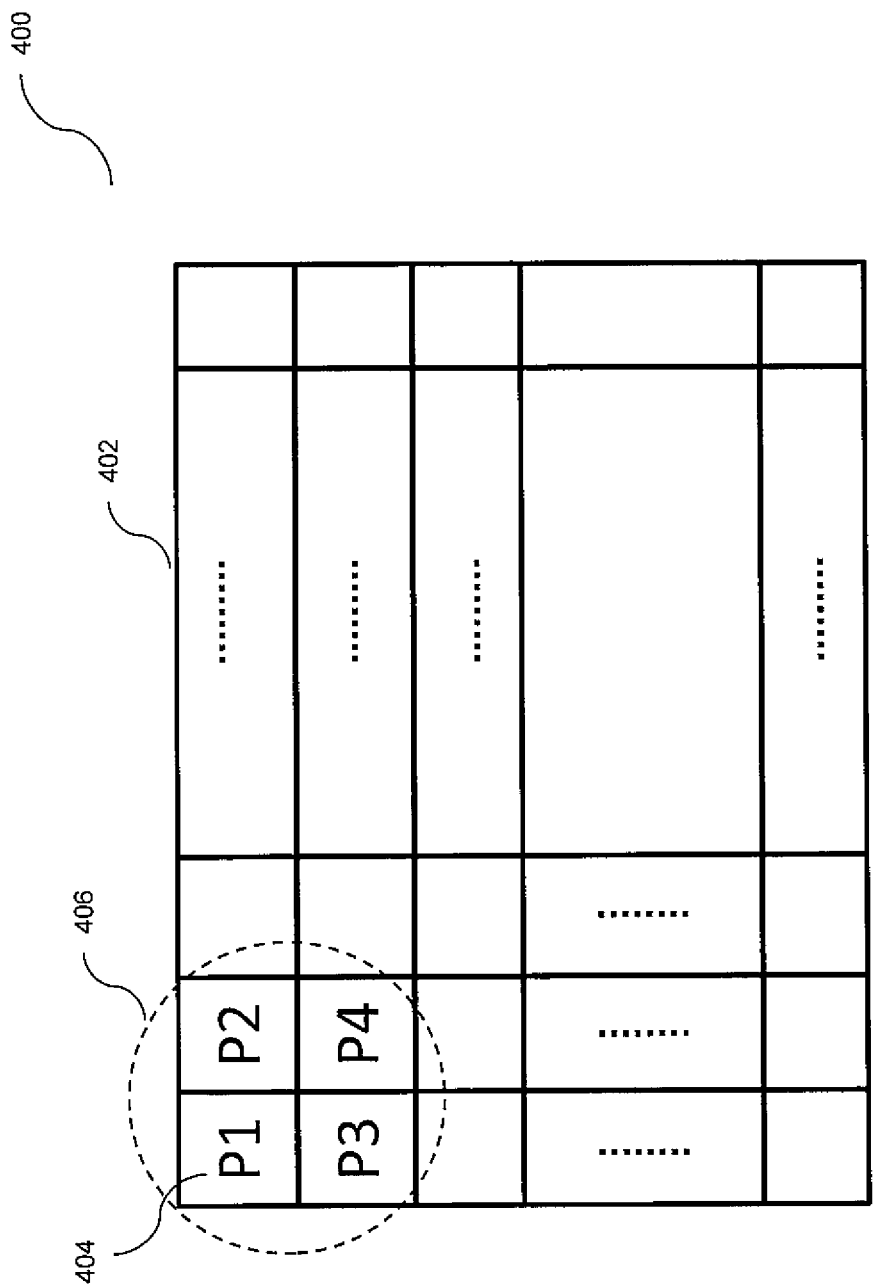
FIG. 4 is a diagram illustrating the application of the two-color pixel in a large photodetector array included in an image sensor, according to some embodiments of the present application.

FIG. 4 is a diagram illustrating the application of the two-color (or dual-tone) pixel (described above) in a large photo-detector array included in an image sensor, according to some embodiments of the present application. For example, the image sensor 400 may include a light detection array 402 including individual two-color pixels 404 laid out in the form of matrix or grid. According to some embodiments of the present invention, two-color pixels 404 may each include a dual-band photovoltaic detector 200 and a dual-band photovoltaic detector circuit 202, as shown in the embodiments of FIG. 2.

Due to the use of two-color pixels 404, the light detection array 402 may be capable of capturing images in two tones or colors. According to some embodiments of the present invention, each color may represent a different spectral band occupying, for example, the infrared or ultraviolet ranges.

While each constituent pixel may only be capable of capturing light of one color at any given time, by grouping two or more two-color pixels, one may form a superpixel capable of capturing light of two colors simultaneously. For example, FIG. 4 illustrates a superpixel 406 including four two-color pixels in the form of a square with alternate color patterns.

Figure 5A:
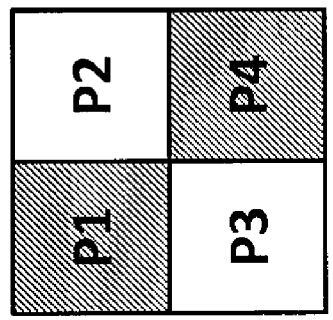
FIG. 5a is a diagram illustrating the ability to pair pixels that are concurrently detecting light of a same band according to a checkerboard pattern, and to alternate the pairing in subsequent frames, according to some embodiments of the present invention.
Figure 5A:
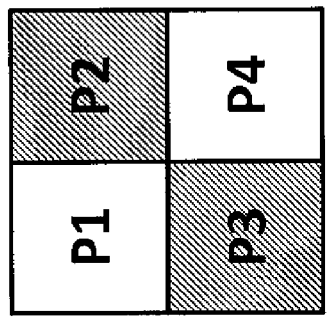
Figure 5A:
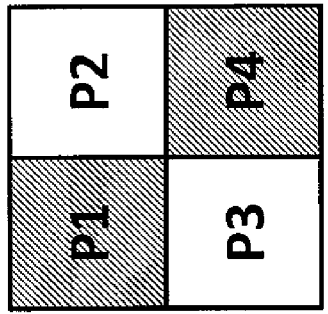

FIG. 5a is a diagram illustrating the ability to pair pixels that concurrently detect light of a same band according to a checkerboard pattern, and to alternate the pairing in subsequent frames, according to some embodiments of the present invention. For example, at frame n (or time $t_n$) pixels P1 and P4 may detect light of a first spectral band while pixels P2 and P3 detect light of a second spectral band. Similarly, at frame n+1 (or time $t_{n+1}$) pixels P1 and P4 may detect light of a second spectral band while pixels P2 and P3 detect light of a first spectral band. The pairing may alternate accordingly at subsequent frames (or times). In some embodiments, digital signal processing (DSP) may be employed to combine a frame and a subsequent frame to form a complete image in both colors of the first band and the second band. With such a technique, the centroid of both colors remains fixed at the superpixel center.

The use of alternate pairings allows the superpixel to achieve temporally simultaneous integration, which allow for greater flexibility in creating color super pixels by varying the number of pixels and the color choice within each superpixel.

Additionally, in some embodiments in which the resolution of the imaging system is not limited by the size of the individual pixels, but rather limited by optical diffraction of the imaging lens (e.g., where the optical blur diameter is comparable to the size of a superpixel), adjacent pixels of a superpixel that detect different colors may appear spatially coincident. Thus, an imaging system capable of spatially coincident, temporally simultaneous, two-color detection may be achieved.

Figure 5B:
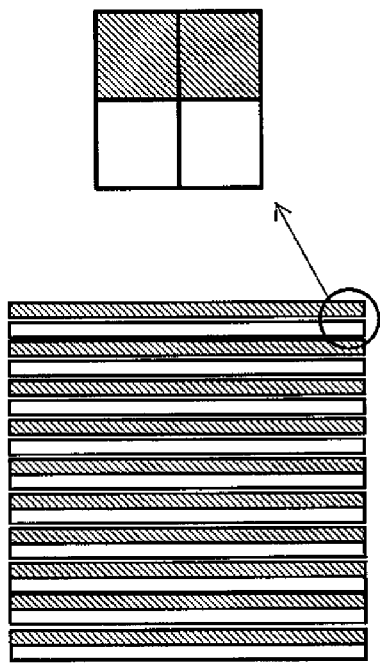
FIGS. 5b and 5c are diagrams illustrating the ability to pair pixels that are concurrently detecting light of a same band according to a vertical and/or horizontal pattern, and to alternate the pairing in subsequent frames, according to some embodiments of the present invention.
Figure 5C:
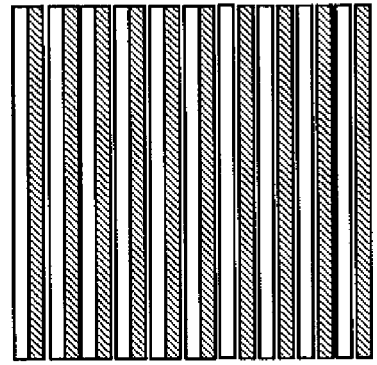

FIGS. 5b and 5c are diagrams illustrating the ability to pair pixels that concurrently detect light of a same band according to a vertical and/or horizontal pattern, and to alternate the pairing in subsequent frames, according to some embodiments of the present invention. Similar to the embodiments illustrated in FIG. 5a, the vertical or horizontal lines of each color may alternate and a full image in both colors may be created every two frames. Also, as in the embodiments of FIG. 5a, in the scheme illustrated in FIGS. 5b and 5c, the centroid of each color remains fixed at the superpixel pattern.

In some embodiments of the present invention, electronic spatial dithering may be employed to improve (or reduce) color banding and to produce an image with a higher perceived resolution. Spatial dithering may be achieved by, for example, shifting the superpixel centroid by ½ nominal superpixel (or by one individual pixel) in the horizontal and/or vertical direction from one frame to a subsequent frame.

Additionally, according to some embodiments of the present invention, by employing superpixels, manufacturing yields may be improved (e.g., increased) by detecting and storing the location of a failing (or poorly performing) pixel at the array testing stage, and disregarding signals from that pixel during pixel aggregation at a signal processing stage. For example, in the square four-pixel superpixel 404, if the detected signal and captured noise from each of pixels P1 through P4 is represented by s1 through s4 and n1 through n4, respectively, the signal to noise ratio (SNR) of the superpixel may be represented as $$SNR = (s1+s2+s3+s4)/\sqrt{n1^2+n2^2+n3^2+n4^2}. \quad (4)$$

Assuming, for the sake of simplicity, that the signal and noise power across the four pixels is the same and represented as s and n, respectively, the SNR of a superpixel with no faulty pixels may be calculated as $$SNR(\text{no bad pixels}) = 4s/\sqrt{4n^2} = 2(s/n), \quad (5)$$

However, if one of the pixels, for example, P4, is a faulty pixel and disregarded at the pixel aggregation stage, SNR of the superpixel with one bad pixel may be calculated as $$SNR(\text{one bad pixel}) = 3s/\sqrt{3n^2} = 1.73(s/n), \quad (6)$$

which, as can be seen, is not far from the SNR of a superpixel with no faulty pixels. Similarly, with two faulty pixels, the SNR will only drop to approximately 1.41 (s/n). Thus, the use of a superpixel may add robustness to the image sensor design, increasing manufacturing yield without sacrificing overall system operability.

Further, because some embodiments of the present invention have the capability to simultaneously detect two or more colors in a superpixel, and due to the pipelining of the integration and read process, they may be employed in high speed imaging systems capable of capturing fast events (as may be desired in an airborne missile warning system, which may be required to distinguish an approaching missile from a harmless flare).

What is claimed is:

1. A method for sensing using a multi-band photovoltaic detector, the method comprising:
   biasing the photovoltaic detector using a bias voltage at a mid-point of a detector substrate bias voltage range;
   selecting a first band of the multi-band photovoltaic detector;
   sensing a first current from a first diode of the multi-band photovoltaic detector, the first diode being associated with the first band;
   re-biasing the photovoltaic detector using the bias voltage at the mid-point of the detector substrate bias voltage range;
   selecting a second band of the multi-band photovoltaic detector; and
   sensing a second current from a second diode of the multi-band photovoltaic detector, the second diode being associated with the second band.

2. The method of claim 1, wherein the selecting the first band further comprises:
   reverse biasing the first diode; and
   forward biasing the second diode,
   wherein said reverse biasing the first diode and said forward biasing the second diode are performed substantially simultaneously.

3. The method of claim 1, wherein the selecting the second band further comprises:
   reverse biasing the second diode; and
   forward biasing the first diode,
   wherein said reverse biasing the second diode and said forward biasing the first diode are performed substantially simultaneously.

4. A multi-band photovoltaic detector circuit comprising:
   a first band selector configured to select a first band of the multi-band photovoltaic detector;
   a first band switch controlled by the first band selector and configured to reverse bias a first diode of a back-to-back photovoltaic detector, the first diode being associated with the first band;
   a first reset switch controlled by the first band selector and coupled to a readout line;
   a second band selector configured to select a second band of the multi-band photovoltaic detector;
   a second band switch controlled by the second band selector and configured to reverse bias a second diode of the back-to-back photovoltaic detector, the second diode being associated with the second band;
   a second reset switch controlled by the second band selector and coupled to the readout line; and
   first and second bias control switches configured to bias the back-to-back photovoltaic detector at a mid-point of a detector substrate bias voltage range.

5. The multi-band photovoltaic detector circuit of claim 4, wherein the first band switch is further configured to channel a first current to the readout line, and the second band switch is further configured to channel a second current to the readout line.

6. The multi-band photovoltaic detector circuit of claim 4, wherein the first band switch is coupled to a first band bias voltage and the second band switch is coupled to a second band bias voltage.

7. The multi-band photovoltaic detector circuit of claim 4, wherein the first band switch and the second band switch are coupled to the back-to-back photovoltaic detector through a single-bump node.

8. The multi-band photovoltaic detector circuit of claim 4, wherein the first diode is configured to be forward-biased when the second diode is reverse-biased and the second diode is configured to be forward-biased when the first diode is reverse-biased.

9. The multi-band photovoltaic detector circuit of claim 4, further comprising an integration capacitor having a second electrode coupled to the readout line and a first electrode coupled to a first power supply.

10. The multi-band photovoltaic detector circuit of claim 9, wherein the first power supply is at a voltage substantially equal to a lower substrate voltage.

11. A multi-band photovoltaic detector circuit comprising:
   a first band selector configured to select a first band of the multi-band photovoltaic detector;
   a first band switch controlled by the first band selector and configured to reverse bias a first diode of a back-to-back photovoltaic detector, the first diode being associated with the first band;
   a first reset switch controlled by the first band selector and coupled to a readout line;
   a second band selector configured to select a second band of the multi-band photovoltaic detector;
   a second band switch controlled by the second band selector and configured to reverse bias a second diode of the back-to-back photovoltaic detector, the second diode being associated with the second band;
   a second reset switch controlled by the second band selector and coupled to the readout line; and
   an integration capacitor having a second electrode coupled to the readout line and a first electrode coupled to a first power supply,
   wherein the back-to-back photovoltaic detector is biased at a mid-point of a detector substrate bias voltage range, and
   wherein each of the first reset switch and second reset switch is configured to initialize a voltage across the integration capacitor to a first initialization voltage and a second initialization voltage, respectively.

12. The multi-band photovoltaic detector circuit of claim 11, wherein the first initialization voltage is substantially equal to zero volts and the second initialization voltage is substantially equal to a voltage difference between an upper substrate voltage and a lower substrate voltage.

13. A multi-band light-detecting superpixel comprising:
   at least four pixels, each pixel of the at least four pixels comprising a back-to-back photovoltaic detector and a multi-band photovoltaic detector circuit, wherein each back-to-back photovoltaic detector is configured to detect light in a first band and in a second band,
   wherein each of the pixels is configured to selectively detect light in the first band or the second band, and
   wherein the multi-band photovoltaic detector circuit comprises:
      a first band selector configured to select a first band of the multi-band photovoltaic detector;
      a first band switch controlled by the first band selector and configured to reverse bias a first diode of a back-to-back photovoltaic detector, the first diode being associated with the first band;
      a first reset switch controlled by the first band selector and coupled to a readout line;
      a second band selector configured to select a second band of the multi-band photovoltaic detector;
      a second band switch controlled by the second band selector and configured to reverse bias a second diode of the back-to-back photovoltaic detector, the second diode being associated with the second band;
      a second reset switch controlled by the second band selector and coupled to the readout line; and
      first and second bias control switches configured to bias the back-to-back photovoltaic detector at a mid-point of a detector substrate bias voltage range,
      wherein the back-to-back photovoltaic detector is biased at a mid-point of a detector substrate bias voltage range.

14. The multi-band light-detecting superpixel of claim 13, wherein pixels selected to detect light of a same band are positioned according to a checkerboard pattern.

15. The multi-band light-detecting superpixel of claim 13, wherein pixels selected to detect light of a same band are positioned according to a striped pattern.

* * * * *